United States Patent [19]

Walls et al.

[11] Patent Number: 4,533,619

[45] Date of Patent: Aug. 6, 1985

[54] ACID STABILIZERS FOR DIAZONIUM COMPOUND CONDENSATION PRODUCTS

[75] Inventors: John E. Walls, Hampton; Major Dhillon, Hillsborough; Trisha Bentley, Somerville, all of N.J.

[73] Assignee: American Hoechst Corporation, Somerville, N.J.

[21] Appl. No.: 531,807

[22] Filed: Sep. 12, 1983

Related U.S. Application Data

[63] Continuation-in-part of Ser. No. 359,461, Mar. 18, 1982, abandoned.

[51] Int. Cl.$^3$ .......................... G03C 1/60; G03C 1/54; G03F 7/08
[52] U.S. Cl. ..................................... 430/157; 430/171; 430/175; 430/176; 430/177; 430/179; 430/302
[58] Field of Search ............... 430/175, 176, 171, 161, 430/157, 302

[56] References Cited

U.S. PATENT DOCUMENTS

| | | | |
|---|---|---|---|
| 2,495,827 | 1/1950 | Slifkin | 430/171 |
| 2,649,373 | 8/1953 | Neugebauer et al. | 430/175 |
| 2,871,119 | 1/1959 | Weegar et al. | 430/175 |
| 3,219,447 | 11/1965 | Neugebauer et al. | 430/171 |
| 3,235,382 | 2/1966 | Neugebauer et al. | 430/302 |
| 3,679,419 | 7/1972 | Gillich | 430/175 |
| 4,347,303 | 8/1982 | Asano et al. | 430/176 |

FOREIGN PATENT DOCUMENTS 1280885  7/1972  United Kingdom ............... 430/175

Primary Examiner—Charles L. Bowers, Jr.
Attorney, Agent, or Firm—Michael J. Tully; James C. Lydon; Richard S. Roberts

[57] ABSTRACT

This invention relates to light sensitive diazonium compound condensation products stabilized against degradation caused by heat and/or prolonged storage employing, as stabilizers, an acid selected from the group consisting of benzoic acid, m-nitro benzoic acid, p(p-anilino phenylazo) benzene sulfonic acid, 4,4'-dinitro-2,2'-stilbene disulfonic acid, itaconic acid, and mixtures thereof. The invention also relates to presensitized reproduction materials comprising the acid stabilized diazonium compound condensation products.

11 Claims, No Drawings

ACID STABILIZERS FOR DIAZONIUM COMPOUND CONDENSATION PRODUCTS

This application is a continuation in part of application Ser. No. 06/359,461, filed Mar. 18, 1982, abandoned.

BACKGROUND OF THE INVENTION

The present invention relates to stabilizers for light sensitive diazonium compounds and to presensitized reproduction materials such as lithographic plates having improved stability to the action of heat/or and moisture.

Presensitized reproduction materials used as used for planographic printing processes generally comprise a plate base or support member having a subbase coating or layer, over which is applied a photosensitive coating composition. The plate base may be a flexible sheet such as paper, plastic or metal which is treated to provide a hydrophilic or otherwise prepared surface upon which a photosensitive coating will adhere. In the case of metal plates, aluminum sheeting is most commonly employed as the base material having a grained or etched surface and/or a subbase formed by silica based coatings or by anodization of the aluminum in acidic electrolytic baths.

Diazonium compounds most commonly employed in the preparation of light sensitive compositions suitable for lithographic plate applications or photoresist applications may be characterized by the generic structure $A-N_2^+X^-$, wherein A is an aromatic or heterocylic residue and X is the anion of an acid.

Specific examples of light sensitive diazonium materials useful as aforementioned include higher molecular weight compositions obtained, for example, by the condensation of certain aromatic diazonium salts in an acid condensation medium with active carbonyl compounds such as formaldehyde, as disclosed for example in U.S. Pat. Nos. 2,063,631 and 2,667,415.

More recently, improved diazonium materials within the above generic formula have been developed which are faster, more adherable to support materials and exhibit lessened sensitivity to moisture. These include the reaction products having the composition of Formula I.

FORMULA I:

At least one diazonium salt having the structure:

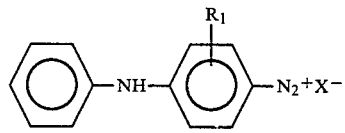

wherein $R_1$ is selected from the group consisting of H, an alkoxy group having from 1 to 4 carbon atoms, and a 2-hydroxy-ethoxy group, and X is the anion of the diazonium salt,
condensed with:
at least one compound of the general formula $R(-CH_2-OR_2)_n$ wherein n is an integer from 1 to 4, R is a residue produced by the splitting off of n hydrogen atoms from a diphenyl ether, and $R_2$ is an alkyl group with 1 to 4 carbon atoms, said condensation product containing, on the average, 0.25 to 0.75 unit derived from $R(-CH_2-OR_2)_n$ per diazo group.

Such materials are disclosed in U.S. Pat. No. 3,679,419, incorporated herein by reference.

Other diazonium compound condensation products include the polycondensation products having the composition of Formula II.

FORMULA II:

At least one $A-N_2^+X^-$ compound condensed with at least one compound of the formula $E(CHR_a-OR_b)_m$ in which $A-N_2X$ is a radical of a compound selected from the group consisting of a compound of the formula $(R_1-R_3)_pR_2-N_2X$ and

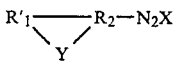

wherein $R_1$ is an aryl group of the benzene or napthalene series $R'_1$ is an arylene group of the benzene or napthalene series $R_2$ is a phenylene group $R_3$ is a single bond or one of the groups $-(CH_2)_q-NR_4-$ $-O-(CH_2)-NR_4-$ $-S-(CH_2)_r-NR_4-$ $-S-CH_2-CO-NR_4-$ $-O-R_5-O-$ $-O-$ $-S-$ or $-CO-NR_4-$ the left-hand free valence of the specified groups is attached to $R_1$ and the right-hand valance is attached to $R_2$
wherein
q is a number from 0 to 5
r is a number from 2 to 5
$R_4$ is selected from the group consisting of hydrogen, alkyl with 1 to 5 carbon atoms, aralkyl with 7 to 12 carbon atoms, and aryl with 6 to 12 carbon atoms,
$R_5$ is an arylene group having 6 to 12 carbon atoms
Y is one of the groups $-NH-$, and $-O-$
X is an anion
P is a number from 1 to 3
E is a residue obtained by splitting off m H atoms from a compound free of diazonium groups selected from the group consisting of aromatic amines, phenols, thiophenols, phenol ethers, aromatic thioethers, aromatic heterocyclic compounds, aromatic hydrocarbons and organic acid amines,
$R_a$ is selected from the group consisting of hydrogen and phenyl,
$R_b$ is selected from the group consisting of hydrogen and alkyl and acyl groups having 1 to 4 carbon atoms, and a phenyl group, and
m is an integer from 1 to 10, are reacted in a strongly acid condensation medium and under condensation conditions sufficient to produce a polycondensation product of an aromatic diazonium compound containing, on the average, about 0.1 to 50 $B_1$ units per unit of $A—N_2X$.

Still other diazonium compound condensation products include those materials having repeating units of the composition of Formula III.

FORMULA III:

At least one $A—N_2{}^+X^-$ compound condensed with at least one compound of the structure B, comprising repeating units of each of the general types $A—N_2X$ and B which are linked by methylene groups, in which $A—N_2X$ is a radical of a compound of one of the general formulae $(R_1—R_3—)_pR_2—N_2X$ and

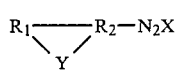

wherein
$R_1$ is an arylene group of the benzene or naphthalene series
$R_2$ is a phenylene group
$R_3$ is a single bond or one of the groups $—(CH_2)_q—NR_4—$ $—O—(CH_2)_r—NR_4—$ $—S—(CH_2)_r—NR_4—$ $—S—(CH_2)_r—CO—NR_4—$ $—O—R_5—O—$ $—O—$ $—S—$ or $—CO—NR_4—$ the left-hand free valence of the specified groups is attached to $R_1$ and the right-hand free valence is attached to $R_2$
wherein
q is a number from 0 to 5
r is a number from 2 to 5
$R_4$ is selected from the group consisting of hydrogen, alkyl with 1 to 5 carbon atoms, aralkyl with 7 to 12 carbon atoms, and aryl with 6 to 12 carbon atoms,
$R_5$ is an arylene group having 6 to 12 carbon atoms
$—Y—$ is one of the groups $—NH—$, and $—O—$,
X is the anion of the diazonium compound, and
p is a number from 1 to 3, and
B is a radical of a compound selected from the group consisting of aromatic amines, phenols, thiophenols, phenol ethers, aromatic thioethers, aromatic hetercyclic compounds, aromatic hydrocarbons and organic acid amides, in which the aromatic nuclei are unsubstituted or substituted by at least one substituent activating condensation and selected from the group consisting of $—NR_7R_8$, $—N(R_8)_2$, $—OR_7$, $—OR_8$, $—R_8$, and $—SR_8$, wherein
$R_7$ is $—H$, $—CO$—alkyl, $—CO$—aryl, $—SO_2$—alkyl, $—SO_2$—aryl, $—COHN_2$, or $—CSNH_2$, and
$R_8$ is $—H$, —alkyl, —aryl or —aralkyl, the alkyl groups having 1 to 10, the aryl groups 6 to 20 and the arallkyl groups 7 to 20 carbon atoms,
which diazonium compound contains, on the average, about 0.01 to 50 B units per unit of $A—N_2X$.

Yet another category of extremely fast light sensitive diazonium compound condensation products are those disclosed in co-pending application Ser. No. 06/359,335, filed in the U.S. Patent Office on Mar. 18, 1982, which is a continuation-in-part of Ser. No. 06/245,837, filed in the U.S. Patent Office on Mar. 20, 1981. These materials may be characterized by the composition of Formula IV.

FORMULA IV:

The condensation product of oligomers having the structure:

$$R—M(Y—M)_m—R \atop \overset{\displaystyle T}{|}$$

wherein: R is selected from the group consisting of $$CH_3—\underset{\underset{\displaystyle |}{\displaystyle CH_3}}{\overset{\overset{\displaystyle OH}{\displaystyle |}}{C}}—CH_3, \ —CH_2OH, \ —CH_2O(CH_2)_nCH_3, \ —CH_2O\overset{\overset{\displaystyle O}{\displaystyle \|}}{C}CH_3,$$

$—CH_2Cl$, and $—CH_2Br$;

n is an integer from 0 to 3;
M is an aromatic radical of one or more compounds selected from the group consisting of aromatic hydrocarbons, diaryl ethers, diaryl sulfides, diaryl amines, diaryl sulfones, diaryl ketones and diaryl diketones;
m is 1 to about 9;
Y is selected from the group consisting of $—CH_2—$ and $—CH_2OCH_2—$; and
T is the same as R when Y is $—CH_2—$ and is hydrogen when Y is $—CH_2—O—CH_2—$,
with diazonium salts having the structure:

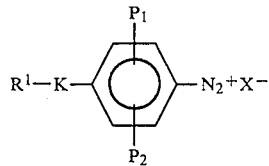

wherein:
R' is selected from the group consisting of phenyl and $C_1$ to $C_4$ alkyl substituted phenyl;
K is selected from the group consisting of $$\underset{\displaystyle |}{\overset{\overset{\displaystyle H}{\displaystyle |}}{—N—}},$$

$—S—$, $—O—$, and $—CH_2—$, or is absent;
P and $P_1$ are selected from the group consisting of $C_1$ to $C_4$ alkyl, methoxy, ethoxy, butoxy, and H;
$P_1$ may be the same as P or different; and
X is an anion.

Whereas recently developed, faster diazonium compound condensation products offer many advantages in terms of speed and quality which render them extremely suitable in applications requiring low energy light exposure, including laser exposure applications, a major drawback is their decreased stability to heat. Whereas many of the less sensitive low molecular weight diazos exhibit a shelf life of weeks or months, under normal storage conditions, sensitized printing plates coated with the newer materials have a shelf life measured in hours, especially at higher storage temperatures approaching 100° C.

Examples of prior art materials which are known diazo stabilizers in planographic printing plate applications include aryl and haloaryl sulfonic acids as taught in U.S. Pat. No. 2,649,373; phosphoric and sulfonic acids as taught in U.S. Pat. No. 3,679,419; benzophenone compounds as disclosed in U.S. Pat. No. 3,503,330; and diazo-borofluoride salts as taught in U.S. Pat. No. 3,933,499. U.S. Pat. No. 4,172,729 discloses a presensitized diazo lithographic plate having improved shelf life and printing performance containing up to 5% by weight of oxalic acid or a salt thereof as a stabilizer. The patent also comparatively recites the utilization of other additives such as citric, phosphoric, sulfonic, boric, sulfuric, polyphosphoric, adipic, sulfamic and tartaric acids as well as glycine and other acid salts.

Stabilizers have also been employed in two component light sensitive diazotype photographic compositions. These compositions are used in photographic processes where dyes are formed in-situ as the result of a coupling reaction between an undecomposed diazonium salt and a coupling component. The object of stabilization in these systems is to inhibit premature coupling of the diazonium salt and coupler during storage and prior to use. While the chemistry in such systems differs from the planographic systems disclosed herein, stabilizers similar to those employed in planographic systems have been suggested by the prior art.

Examples of such prior art stabilizers include aryl and haloaryl sulfonic acids and their salts as taught in U.S. Pat. No. 3,102,812; certain unsaturated organic acids such as crotonic, pentenic, sulfo cinnamic and derivatives of acrylic acid as taught in U.S. Pat. No. 2,354,088; certain anthranilic acids as taught in U.S. Pat. No. 2,496,240; certain acids such as tartaric, citric, boric, phosphoric and polyphosphoric such as taught in U.S. Pat. No. 3,615,574; certain acids including maleic, malonic, trichloroacetic, glyoxilic and sulfanilic as disclosed in U.S. Pat. No. 3,660,581; boric acid ester as disclosed in U.S. Pat. No. 3,679,421; certain organic acid amides, ketoacids, cyanoacids, cyclic acid derivatives, nitro acids and acetylenic acids as disclosed in U.S. Pat. No. 3,453,112; aromatic amines as disclosed U.S. Pat. No. 3,704,129; and saturated and unsaturated gamma lactones as disclosed in U.S. Pat. No. 2,374,563.

Whereas many of the aforementioned acid stabilizers might be considered suitable for the stabilization of any diazonium composition, it has been found that many of these acids affect the light sensitivity and speed of the diazonium composition. This is of particular disadvantage in the case of diazonium compound condensation products having the Formulas I through IV above since the enhancement of stability of such materials at the expense of speed and light sensitivity would render them of decreased utility in those applications where speed is of critical importance.

Accordingly, it is an object of this invention to provide light sensitive diazonium compound condensation product compositions having enhanced stability against heat and/or moisture and improved shelf life.

Another object is to provide light sensitive diazonium compound condensation product based photoresist materials and printing plates having enhanced stability and shelf life.

Another object is to impart increased shelf life to fast acting diazonium compound condensation product sensitized printing plates without a significant sacrifice of the speed of the diazonium compound condensation product.

SUMMARY OF THE INVENTION

These and other objects of the invention have been achieved by the provision of light sensitive diazonium compound condensation product compositions containing stabilizing amounts of an acid selected from the group consisting of benzoic acid, m-nitro benzoic acid, p(p-anilino phenylazo)benzene sulfonic acid, 4,4'-dinitro-2,2'-stilbene disulfonic acid, itaconic acid, and mixtures thereof.

DETAILED DESCRIPTION OF THE INVENTION

Diazonium compounds subject to stabilization in accordance with the present invention include those materials falling within the scope of the formula $A-N_2^+X^-$ set forth above, including compositions of the specific Formulas I–IV. Specific materials include, but are not limited to, the product of condensation of p-diazo diphenyl amine sulfate and paraformaldehyde in sulfuric acid, isolated as the zinc chloride salt, also known as "Diazo Resin No. 4" available from Fairmount Chemical Corporation; the product of the condensation of 3-methoxy-diphenylamine-4-diazonium sulfate and 4,4'-bis-methoxy-methyl-diphenylether in phosphoric acid, isolated as the naphthalene-2-sulfonic acid salt, as disclosed in U.S. Pat. No. 3,679,419; the product of the condensation of p-diazo diphenyl amine sulfate and paraformaldehyde in phosphoric acid, isolated as the hexafluorophosphate salt; and the reaction product of a homocondensed oligomer such as based on a 4,4'-bis-alkoxy diphenyl ether condensed with a 3-alkoxy-4-diazo diphenyl amine sulfate in phosphoric acid, isolated as the mesitylene sulfonate salt.

Diazonium compound condensation products which are most advantageously stabilized in accordance with the teachings of the present invention are those extremely light sensitive materials exhibiting an absorbtivity of 45% or less when scanned in the range of 350 to 390 nanometers using a Perkin-Elmer UV visible spectrometer (Model #559) under standard test conditions. The diazonium compound condensation product is evaluated as a $1 \times 10^{-3}\%$ by weight solution in methyl cellosolve in a cuvette, blanked out against itself, at a slit of one nanometer and a range of 0–1. The stabilizers of the present invention not only serve to stabilize such fast acting diazonium compound condensation products, but do so without a serious sacrifice of speed or image quality.

The stabilizers within the scope of the present invention are an acid selected from the group consisting of benzoic acid, m-nitro benzoic acid, p(p-anilino phenylazo)benzene sulfonic acid, 4,4'-dinitro-2,2'-stilbene disulfonic acid, itaconic acid, and mixtures thereof. In general, the acid stabilizers of this invention impart at least a three fold increase in the time in which degradation of a diazonium compound condensation product occurs at 100° C. under the test conditions set forth herein.

The relative proportions of diazonium compound condensation product and acid stabilizer required to provide effective stabilization will vary depending upon the identity of the diazonium compound condensation product and the particular acid. In general, from about 0.1 to about 2 parts by weight stabilizer per part by weight diazonium compound will prove satisfactory. Normally, from 0.25 to 1.0 part by weight acid per part by weight diazonium compound condensation product is sufficient.

The stabilized light sensitive diazonium compositions of this invention may be used in reproduction layers in the conventional way. They may be dissolved in the appropriate solvent in which they are soluble, e.g., water or organic solvents, and coated on supports and dried to form printing plates, color proofing foils, resists for printed circuitry and the like. Such supports include grained or anodized aluminum, transparent plastic sheets, paper, copper and the like.

The layer compositions may also include other additives known in the art such as pigments, dyes, polymer binders, plasticizers, sensitizers, wetting agents, indicators and the like. Representative conventional additives and polymer binders are set forth in more detail in U.S. Pat. No. 3,679,419.

All additives should be selected such that they are compatible with the diazonium compound condensation product, the stabilizer and polymeric binder, if any, employed in the formulation of the light sensitive layers, as well as the solvent employed in preparing the layer. Suitable solvents include water, lower aliphatic alcohols and ethers, and aromatic and aliphatic hydrocarbons. Suitable polymer binders include materials soluble in water or basic aqueous systems such as polyvinyl alcohol, polyacrylamides, copolymers of vinyl aromatic compounds with acidic comonomers such as maleic anhydride. Water insoluble binders such as phenol and alkyd resins and acrylic polymers may also be used. Polymeric binders where employed, are generally used at a level of from about 1 to 50 parts by weight per part by weight of diazonium compound condensation product.

The stabilized diazonium compositions of the present invention are most efficiently prepared by forming a solution of the diazonium compound condensation product and acid stabilizer in a solvent in which both materials are soluble. The solution may also include other additives dissolved or dispersed therein. The solution may be applied to the appropriate substrate by any known technique such as swabbing, whirl coating or simple wipe-on, followed by drying to drive off the solvent. Coating weights conventional in printing plate applications generally should range between 0.1 to 5.0 g./m$^2$.

The following Examples are illustrative of the invention.

CONTROL A

A sensitized printing plate was prepared according to the following technique. A web of aluminum was mechanically roughened by surface graining to increase the surface area. The roughened plate was well rinsed and subsequently rendered hydrophilic by treatment with polyvinylphosphonic acid as taught in U.S. Pat. No. 4,153,461. The treated plate was well rinsed and then dried.

A section (20"×20") was whirl coated with a 0.2% by weight solution, in de-ionized water, of the product of the condensation of p-diazo diphenyl amine sulfate and paraformaldehyde in sulfuric acid, isolated as the zinc chloride salt, which is designated as Diazo A. The plate was then dried.

CONTROL B

The control A above was repeated except in this case the diazonium compound condensation product employed was a 0.2% by weight solution, in 2-methoxy ethanol, of the product of the condensation of p-diazo diphenyl amine sulfate and paraformaldehyde, in phosphoric acid, isolated as the hexafluorophosphate salt, which is designated as Diazo B. Coated plates were prepared as set forth in Control A.

CONTROL C

The control B above was repeated except that in this case the diazonium compound condensation product employed was a 0.2% by weight solution, in 2-methoxy ethanol, of the homo condensation product of 4,4'-bis-methoxy-methyl diphenyl ether with 3-methoxy-4-diazo diphenyl amine sulfate, isolated as the mesitylene sulfonate salt, which is designated Diazo C. This diazonium compound condensation product and analogous diazoniums are disclosed in co-pending U.S. patent application Ser. No. 06/359,335 filed on Mar. 18, 1982.

The control plates prepared above were tested for speed and stability as follows. The plates were cut into a plurality of 5"×5" pieces and a first piece was exposed with a mercury vapor light source using a test flat having a 21 step Stauffer Step wedge, each increasing step representing a change in density equal to $\sqrt{2}$. The vacuum frame was equipped with a light integrated for precise and automatic shutter control. Exposure was made in units (1 unit=12 millijoules per cm$^2$) and each test plate was exposed for 2 units. The exposed plate sample was then developed with Western Jet Black Lacquer Developer manufactured by Western Litho. After development, the control plates were found to have clean hydrophilic background areas. The step wedge of the Control A plate was found to have 1 solid and 3 ghost steps, hence the designation 1/3. The Control B plate was found to have 2 solid and 2 ghost steps, hence the designation 2/2. The Control C plate was found to have 4 solid and 2 ghost steps, hence the designation 4/2.

Heat stability of the plates was determined as follows. The unexposed 5" by 5" pieces of the Control plates were placed in an oven maintained at 100° C., for an accelerated aging test. One sample of each plate was removed every 5 minutes up to a total residence time of 60 minutes, and each removed plate was evaluated by the Step Wedge exposure technique as described above. The change in step wedge relative to the control after aging is an indication of stability. An increase in the solid step and/or ghost step indicates an undesired degrading of the coating. A plate is considered lithographically unacceptable when the loss of hydrophilicity is such that all or a substantial portion of the plate surface scums when developed such that a step wedge reading can not be made.

Using the above technique, it was found that the Control A sample was completely degraded at 10 minutes residence time at 100° C., and the solid/ghost at 5 minutes had deteriorated to 4/5. In the case of the Control B sample, complete degradation took place at 15 minutes residence time and the solid/ghost at 10 minutes had deteriorated to 5/4. Control C degraded at 10 minutes residence time and the solid/ghost at 5 minutes had deteriorated to 7/5. Each of these samples containing no stabilizer would be considered lithographically unacceptable based on a predictable early deterioration of the photosensitive plates under normal commercial conditions of shipping and storage.

EXAMPLES 1-5

In the same manner as described for Control A, B and C above, five different formulations were prepared by forming solutions in solvent (deionized water in the case of Control A and 2-methoxy ethanol in the case of Controls B and C) of the respective A, B and C diazonium compound condensation products at 0.2% by weight mixed with 0.2% by weight of each acid. The formulations were coated on aluminum plates, dried and tested as set forth above. Results for each of the acids evaluated are set forth in Table 1.

The numbers set forth under the time column in Table 1 represent the oven time at which the diazonium composition had degraded to the point where no differentiation in the various Step Wedge readings could be observed. The Step Wedge readings represent the readings obtained for the last acceptable plate sample removed from the oven 5 minutes previous to the removal of the unacceptable plate.

EXAMPLES 6-22

In a manner identical to that described in examples 1-5, other diazonium formulations were prepared using the same diazonium salts, but substituting other acids which, for the purposes set forth herein, were found to be unacceptable in terms of imparting heat stability. Results for each acid tested are also set forth in Table 1.

As can be seen from an analysis of Table 1, the acids of Examples 1-5 all imparted at least a three fold improvement in heat stability of the diazonium compound condensation products evaluated as compared with the controls, without a sacrifice of speed. The improvement exhibited by the utilization of stearic acid in Example 9 is considered marginal at best. The acids utilized in Examples 6-8 exhibited varying degrees of heat stability, but at a significant cost in terms of speed. This is reflected by a comparison of the solid/ghost step wedge results for these materials which are lower than the results obtained for the controls. All of the materials evaluated in Examples 10-22 not only gave rise to little or no improvement in heat stability, but actually proved deliterious when compared with the controls. All of these latter materials would be characterizable as lithographically unacceptable.

TABLE 1

|  | ACID STABILIZER | DIAZO A Time (minutes) at 100° C. | DIAZO A Solid/Ghost Start | DIAZO A Solid/Ghost End | DIAZO B Time (minutes) at 100° C. | DIAZO B Solid/Ghost Start | DIAZO B Solid/Ghost End | DIAZO C Time (minutes) at 100° C. | DIAZO C Solid/Ghost Start | DIAZO C Solid/Ghost End |
|---|---|---|---|---|---|---|---|---|---|---|
| Ex 1 | 4,4'-dinitro-2,2'-stilbene disulfonic | not soluble | | | 60 | 2/2 | 2/3 | 55 | 4/1 | 5/3 |
| Ex 2 | Itaconic | 45 | 3/2 | 6/3 | 60 | 2/2 | 4/2 | 55 | 4/1 | 6/2 |
| Ex 3 | p(p-anilino phenylazo) benzene sulfonic | 45 | 6/2 | 6/4 | 60 | 3/3 | 4/3 | 50 | 5/2 | 6/2 |
| Ex 4 | m-nitro benzoic | 45 | 4/3 | 5/3 | 60 | 2/4 | 3/3 | 55 | 4/2 | 5/4 |
| Ex 5 | benzoic | 35 | 4/3 | 6/6 | 50 | 3/4 | 4/3 | 40 | 5/2 | 6/4 |
| CONTROL | | 10 | 1/3 | 4/5 | 15 | 2/2 | 5/4 | 10 | 4/2 | 7/5 |
| Ex 6 | phosphoric | 45 | <1/2 | 1/3 | 50 | 1/2/2 | 1/2 | 40 | 1/2 | 2/2 |
| Ex 7 | citric | 15 | <1/2 | 2/2 | 25 | 1/2 | 2/2 | 15 | 2/2 | 4/4 |
| Ex 8 | tartaric | 20 | <1/2 | 2/2 | 20 | 1/2 | 2/3 | 15 | 2/2 | 4/6 |
| Ex 9 | stearic | 30 | 3/3 | 4/3 | 40 | 3/2 | 3/3 | 35 | 5/2 | 6/3 |
| Ex 10 | 1,2,4,5 benzene tetracarboxylic | 5 | 0/2 | — | not tested | | | 5 | 2/2 | — |
| Ex 11 | benzene hexacarboxylic | 5 | 0/2 | — | " | | | 5 | 2/2 | — |
| Ex 12 | benzene phosphonic | 5 | 1/2 | — | " | | | 5 | 2/3 | — |
| Ex 13 | mandelic | 10 | 1/3 | 5/4 | " | | | 15 | 4/3 | 7/3 |
| Ex 14 | norbuene-2,3-dicarboxylic | 0 | — | — | " | | | 0 | — | — |
| Ex 15 | phytic | 5 | 1/2 | — | " | | | 5 | 4/2 | — |
| Ex 16 | ascorbic | 0 | — | — | " | | | 0 | — | — |
| Ex 17 | p-toluene sulfonic | 10 | 1/3 | 5/3 | " | | | 15 | 4/2 | 7/5 |
| Ex 18 | mesitylene sulfonic | 10 | 1/3 | 4/3 | " | | | 15 | 4/3 | 7/3 |
| Ex 19 | dinonyl naphthalene disulfonic | 10 | 1/2 | 5/4 | " | | | 15 | 4/4 | 6/6 |
| Ex 20 | decanoic | not soluble | | | " | | | 5 | 3/3 | — |
| Ex 21 | phthalic | " | | | " | | | 5 | 3/4 | — |
| Ex 22 | oleic | " | | | " | | | 0 | — | — |

What we claim is:

1. A composition comprising a light sensitive diazonium compound condensation product in admixture with an acid selected from the group consisting of benzoic acid, m-nitro benzoic acid, p(p-anilino phenylazo)-benzene sulfonic acid, 4,4'-dinitro-2,2'-stilbene disulfonic acid, itaconic acid and mixtures thereof, said acid being present in an amount sufficient to substantially improve the heat stability of said diazonium compound condensation product, wherein said diazonium compound condensation product is a condensation product of oligomers having the structure:

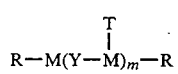

wherein:
R is selected from the group consisting of

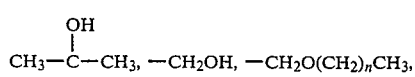

-continued $-CH_2OCCH_3$, $-CH_2Cl$ and $-CH_2Br$;
(with O double-bonded to C in the acetate)

n is an integer from 0 to 3;

M is an aromatic radical of one or more compounds selected from the group consisting of aromatic hydrocarbons, diaryl ethers, diaryl sulfides, diaryl amines, diaryl sulfones, diaryl ketones and diaryl diketones;

m is 1 to about 9;

Y is selected from the group consisting of $-CH_2-$ and $-CH_2OCH_2-$; and,

T is the same as R when Y is $-CH_2-$ and is hydrogen when Y is $-CH_2OCH_2-$;

condensed with diazonium salts having the structure:

$$R'-K-\underset{\underset{P}{|}}{\overset{\overset{P_1}{|}}{Z}}-N_2^+ \ X^-$$

wherein:

Z is the benzene ring;

R' is selected from the group consisting of phenyl and C-1 to C-4 alkyl substituted phenyl;

K is selected from the group consisting of $$-\underset{\underset{}{|}}{\overset{\overset{H}{|}}{N}}-,$$

$-S-$, $-O-$, and $-CH_2-$, or is absent;

P and $P_1$ may be the same or different and are selected from the group consisting of C1 to C4 alkyl, methoxy, ethoxy, butoxy, and H; and, X is an anion.

2. A light sensitive reproduction material comprising a support and a reproduction layer thereon comprising the composition of claim 1.

3. The reproduction material of claim 2 wherein said support comprises aluminum.

4. The reproduction material of claim 2 wherein said support comprises paper, plastic or metal.

5. The composition of claim 1 further comprising one or more compounds selected from the group consisting of pigments, dyes, polymer binders, plasticizers, sensitizers, wetting agents and indicators.

6. The composition of claim 1 wherein said acid is benzoic acid.

7. The composition of claim 1 wherein said acid is m-nitro benzoic acid.

8. The composition of claim 1 wherein said acid is p(p-anilino phenylazo)benzene-sulfonic acid.

9. The composition of claim 1 wherein said acid is 4,4'-dinitro-2,2'-stilbene disulfonic acid.

10. The compositon of claim 1 wherein said acid is itaconic acid.

11. The composition of claim 1 wherein said acid is present in said composition in an amount of from about 0.1 to about 2 parts by weight per part by weight of said diazonium compound.

* * * * *